（12） United States Patent
Uejima et al.

(10) Patent No.: US 12,278,425 B2
(45) Date of Patent: Apr. 15, 2025

(54) RADIO-FREQUENCY MODULE AND COMMUNICATION APPARATUS

(71) Applicant: Murata Manufacturing Co., Ltd., Kyoto (JP)

(72) Inventors: Takanori Uejima, Kyoto (JP); Yuji Takematsu, Kyoto (JP); Yukiya Yamaguchi, Kyoto (JP); Shunji Yoshimi, Kyoto (JP); Satoshi Arayashiki, Kyoto (JP); Mitsunori Samata, Kyoto (JP); Satoshi Goto, Kyoto (JP); Yutaka Sasaki, Kyoto (JP); Masayuki Aoike, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 172 days.

(21) Appl. No.: 18/308,315

(22) Filed: Apr. 27, 2023

(65) Prior Publication Data

US 2023/0268643 A1 Aug. 24, 2023

Related U.S. Application Data

(63) Continuation of application No. PCT/JP2021/037705, filed on Oct. 12, 2021.

(30) Foreign Application Priority Data

Nov. 25, 2020 (JP) .................... 2020-195407

(51) Int. Cl.
*H01Q 1/42* (2006.01)
*H01Q 1/22* (2006.01)
(Continued)

(52) U.S. Cl.
CPC ........... *H01Q 1/422* (2013.01); *H01Q 1/2283* (2013.01); *H01Q 1/38* (2013.01); *H03H 3/02* (2013.01)

(58) Field of Classification Search
CPC ........ H01Q 1/422; H01Q 1/2283; H01Q 1/38; H03H 3/02; H03H 9/0557; H03H 9/02574;
(Continued)

(56) References Cited

U.S. PATENT DOCUMENTS 5,717,249 A 2/1998 Yoshikawa et al.
10,905,037 B2 * 1/2021 Han ...................... H01L 23/66
(Continued)

FOREIGN PATENT DOCUMENTS

JP H08-335836 A 12/1996
JP 2002-359327 A 12/2002
(Continued)

OTHER PUBLICATIONS

International Search Report for PCT/JP2021/037705 dated Jan. 11, 2022.

*Primary Examiner* — Seung H Lee
(74) *Attorney, Agent, or Firm* — MCDONALD HOPKINS LLC

(57) ABSTRACT

A radio-frequency module includes a first base made of a first semiconductor material; a second base that is made of a second semiconductor material having a thermal conductivity lower than that of the first semiconductor material and which includes a power amplifier circuit; a third base including a transmission filter circuit; and a module substrate having a main surface on which the first base, the second base, and the third base are arranged. The first base is joined to the main surface via an electrode. The second base is arranged between the module substrate and the first base in a sectional view and is joined to the main surface via an electrode. At least part of the first base is overlapped with at least part of the second base and at least part of the third base in a plan view.

20 Claims, 8 Drawing Sheets

(51) Int. Cl.
*H01Q 1/38* (2006.01)
*H03H 3/02* (2006.01)

(58) Field of Classification Search
CPC ........ H03H 9/175; H04B 1/0458; H04B 1/18; H04B 1/44; H01L 2224/16225; H01L 23/12; H01L 25/065; H01L 25/07; H01L 25/18
See application file for complete search history.

(56) References Cited

U.S. PATENT DOCUMENTS

| | | | |
|---|---|---|---|
| 11,464,109 B2 * | 10/2022 | Baek | H05K 1/0222 |
| 11,496,172 B2 * | 11/2022 | Onodera | H04B 1/16 |
| 2003/0169575 A1 | 9/2003 | Kuta et al. | |
| 2021/0226652 A1 | 7/2021 | Matsumoto et al. | |
| 2021/0359661 A1 | 11/2021 | Murase | |
| 2023/0006708 A1 * | 1/2023 | Nakagawa | H04B 1/40 |

FOREIGN PATENT DOCUMENTS

| | | |
|---|---|---|
| WO | 2020/090557 A1 | 5/2020 |
| WO | 2020/179541 A1 | 9/2020 |

* cited by examiner

RADIO-FREQUENCY MODULE AND COMMUNICATION APPARATUS

CROSS REFERENCE TO RELATED APPLICATION

This is a continuation of International Application No. PCT/JP2021/037705 filed on Oct. 12, 2021 which claims priority from Japanese Patent Application No. 2020-195407 filed on Nov. 25, 2020. The contents of these applications are incorporated herein by reference in their entireties.

BACKGROUND ART

Technical Field

The present disclosure relates to a radio-frequency module and a communication apparatus.

In mobile communication devices, such as mobile phones, the arrangement configuration of circuit elements composing radio-frequency front-end circuits is increasingly complicated particularly with the progress of multiband communication.

Patent Document 1 discloses a radio-frequency module including a mounting substrate, a duplexer (filter circuit) disposed on the mounting substrate, and a semiconductor integrated circuit (IC) including an amplifier laminated on the duplexer. Laminating the semiconductor IC on the duplexer realizes reduction in size of the radio-frequency module.

Patent Document 1: International Publication No. 2020/179541

BRIEF SUMMARY

However, since the semiconductor IC is made of gallium arsenide (GaAs) having a relatively low thermal conductivity in the technique in the related art, it is difficult to emit heat generated in the amplifier in the semiconductor IC. As a result, the temperature of the semiconductor IC may be increased and the heat may enter the duplexer from the semiconductor IC to degrade characteristics of the duplexer.

In order to resolve the above problem, the present disclosure provides a radio-frequency module and a communication apparatus, which are capable of suppressing the degradation of the characteristics of the filter circuit due to the heat and realizing the reduction in size.

A radio-frequency module according to one aspect of the present disclosure includes a first base at least part of which is made of a first semiconductor material; a second base at least part of which is made of a second semiconductor material having a thermal conductivity lower than that of the first semiconductor material and which includes an amplifier circuit; a third base at least part of which is made of a piezoelectric material and which includes a filter circuit; and a module substrate having a main surface on which the first base, the second base, and the third base are arranged. The first base is joined to the main surface via a first electrode. The second base is arranged between the module substrate and the first base in a sectional view and is joined to the main surface via a second electrode. At least part of the first base is overlapped with at least part of the second base and at least part of the third base in a plan view.

A radio-frequency module according to one aspect of the present disclosure includes a first base at least part of which is made of silicon or gallium nitride and which includes a first electrical circuit; a second base at least part of which is made of gallium arsenide or silicon-germanium and which includes an amplifier circuit; a third base at least part of which is made of a piezoelectric material and which includes a filter circuit; and a module substrate having a main surface on which the first base, the second base, and the third base are arranged. The first base is joined to the main surface via a first electrode. The second base is arranged between the module substrate and the first base in a sectional view and is joined to the main surface via a second electrode. At least part of the first base is overlapped with at least part of the second base and at least part of the third base in a plan view.

According to the radio-frequency module according to one aspect of the present disclosure, it is possible to suppress degradation of characteristics of a filter due to heat and realize reduction in size.

DETAILED DESCRIPTION

Figure 1:
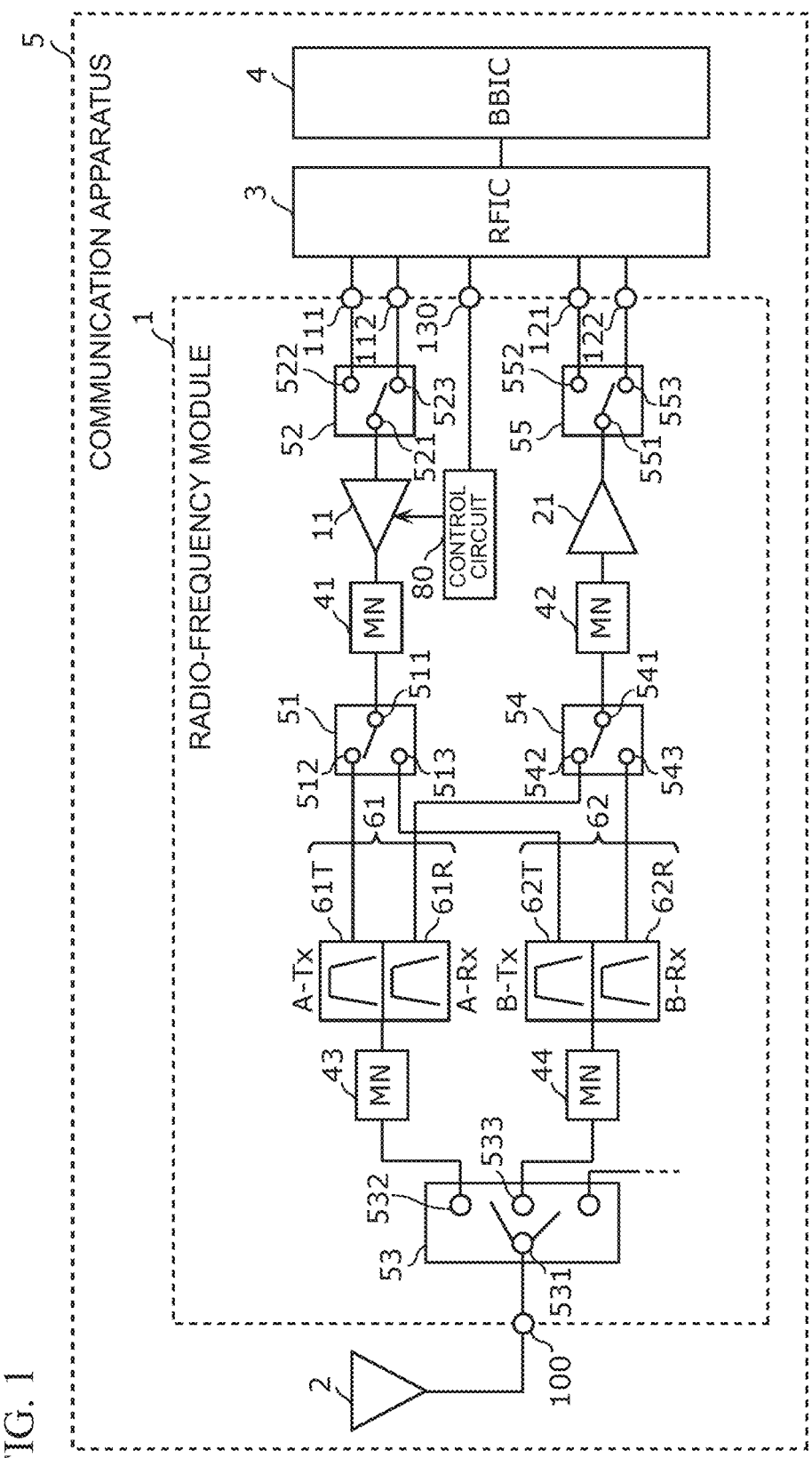
FIG. 1 is a diagram illustrating the circuit configurations of a radio-frequency module and a communication apparatus according to a first embodiment.

Embodiments of the present disclosure will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure.

The respective drawings are schematic diagrams appropriately subjected to emphasis, omission, or adjustment of ratios in order to describe the present disclosure. The respective drawings are not necessarily strictly illustrated and may be different from the actual shapes, positional relationship, and ratios. The same reference numerals and letters are used in the respective drawings to identify substantially the same components and a duplicated description of such components may be omitted or simplified.

In the respective drawings described below, the x axis and the y axis are axes that are orthogonal to each other on a plane parallel to main surfaces of a module substrate. Specifically, when the module substrate has a rectangular shape in a plan view, the x axis is parallel to a first side of the module substrate and the y axis is parallel to a second side orthogonal to the first side of the module substrate. The z axis is an axis vertical to the main surfaces of the module substrate. The positive direction of the z axis indicates the upper direction and the negative direction thereof indicates the lower direction.

In the circuit configuration of the present disclosure, "connected" includes not only direct connection with a connection terminal and/or a wiring conductor but also electrical connection via another circuit element. "Connected between A and B" means connection to both A and B between A and B.

In the arrangement of components of the present disclosure, a "plan view" means viewing an object that is orthographically projected on the x-y plane from the positive side of the z axis. "Overlapping of A with B in a plan view" means overlapping of the area of A orthographically projected on the x-y plane with the area of B orthographically projected on the x-y plane. A "sectional view" means viewing something with being cut along a cross section vertical to the x-y plane. "Arrangement of A between B and C in a sectional view" means passing of at least one line segment, among multiple line segments connecting an arbitrary point in the area of B to an arbitrary point in the area of C, through the area of A on a cross section vertical to the x-y plane. The terms, such as parallel and vertical, indicating the relationship between elements; the terms, such as rectangles, indicating the shapes of the elements; and numerical ranges do not represent only strict meanings but mean inclusion of substantially the same ranges, for example, differences on the order of few percent.

"Arrangement of a component on a substrate" includes arrangement of the component above the substrate without necessarily being in contact with the substrate (for example, lamination of the component on another component arranged on the substrate) and embedding of part of the component or the entire component in the substrate, in addition to arrangement of the component on the substrate with being in contact with the substrate. In addition, "arrangement of a component on a main surface of a substrate" includes arrangement of the component above the main surface without necessarily being in contact with the main surface and embedding of part of the component in the substrate from the main surface side, in addition to arrangement of the component on the main surface with being in contact with the main surface of the substrate.

In the material configuration of the present disclosure, "an object A is made of a material B" means that the major component of A is B. Here, the major component means a component having the highest ratio of weight, among multiple components contained in the object.

First Embodiment

[1.1 Circuit Configurations of Radio-Frequency Module 1 and Communication Apparatus 5]

The circuit configurations of a radio-frequency module 1 and a communication apparatus 5 including the radio-frequency module 1 according to the present embodiment will be described with reference to FIG. 1. FIG. 1 is a diagram illustrating the circuit configurations of the radio-frequency module 1 and the communication apparatus 5 according to a first embodiment.

[1.1.1 Circuit Configuration of Communication Apparatus 5]

As illustrated in FIG. 1, the communication apparatus 5 according to the present embodiment includes the radio-frequency module 1, an antenna 2, a radio-frequency integrated circuit (RFIC) 3, and a baseband integrated circuit (BBIC) 4.

The radio-frequency module 1 transmits a radio-frequency signal between the antenna 2 and the RFIC 3. The internal configuration of the radio-frequency module 1 will be described below.

The antenna 2 is connected to an antenna connection terminal 100 of the radio-frequency module 1. A radio-frequency signal is externally received through the antenna 2 and is supplied to the radio-frequency module 1.

The RFIC 3 is an example of a signal processing circuit that processes the radio-frequency signal. Specifically, the RFIC 3 performs signal processing, such as down-conversion, to a radio-frequency reception signal input through a reception path of the radio-frequency module 1 and supplies a reception signal resulting from the signal processing to the BBIC 4. In addition, the RFIC 3 includes a control unit that controls switch circuits, amplifier circuits, and so on in the radio-frequency module 1. Part or all of the function of the RFIC 3 serving as the control unit may be provided outside the RFIC 3. For example, part or all of the function of the RFIC 3 serving as the control unit may be provided in the BBIC 4 or the radio-frequency module 1.

The BBIC 4 is a baseband signal processing circuit that performs signal processing using an intermediate frequency band lower than the frequency of the radio-frequency signal transmitted by the radio-frequency module 1. For example, an image signal for image display and/or an audio signal for talking with a speaker is used as the signal processed in the BBIC 4.

In the communication apparatus 5 according to the present embodiment, the antenna 2 and the BBIC 4 are optional components.

[1.1.2 Circuit Configuration of Radio-Frequency Module 1]

Next, the circuit configuration of the radio-frequency module 1 will be described. As illustrated in FIG. 1, the radio-frequency module 1 includes a power amplifier circuit 11, a low noise amplifier circuit 21, impedance matching circuits (MNs) 41 to 44, switch circuits 51 to 55, duplexers 61 and 62, a control circuit 80, the antenna connection terminal 100, radio-frequency input terminals 111 and 112, radio-frequency output terminals 121 and 122, and a control terminal 130.

The antenna connection terminal 100 is connected to the antenna 2 in the outside of the radio-frequency module 1.

Each of the radio-frequency input terminals 111 and 112 is an input terminal for receiving a radio-frequency transmission signal from the outside of the radio-frequency module 1. In the present embodiment, the radio-frequency input terminals 111 and 112 are connected to the RFIC 3 in the outside of the radio-frequency module 1.

Each of the radio-frequency output terminals 121 and 122 is an output terminal for supplying the radio-frequency reception signal to the outside of the radio-frequency module 1. In the present embodiment, the radio-frequency output terminals 121 and 122 are connected to the RFIC 3 in the outside of the radio-frequency module 1.

The control terminal 130 is a terminal used for transmitting a control signal. In other words, the control terminal 130 is a terminal for receiving the control signal from the outside of the radio-frequency module 1 and/or a terminal for supplying the control signal to the outside of the radio-frequency module 1. The control signal is a signal concerning control of electronic components included in the radio-frequency module 1. Specifically, the control signal is a digital signal used for controlling the power amplifier circuit 11.

The power amplifier circuit 11 is an example of an amplifier circuit. The power amplifier circuit 11 is capable of amplifying transmission signals in bands A and B. An input end of the power amplifier circuit 11 is connected to the radio-frequency input terminals 111 and 112 via the switch circuit 52. An output end of the power amplifier circuit 11 is connected to transmission filter circuits 61T and 62T via the impedance matching circuit 41 and the switch circuit 51. The configuration of the power amplifier circuit 11 is not particularly limited and may be, for example, a multi-stage amplifier circuit or a differential amplifier circuit.

The low noise amplifier circuit 21 is capable of amplifying reception signals in the bands A and B. An input end of the low noise amplifier circuit 21 is connected to reception filter circuits 61R and 62R via the impedance matching circuit 42 and the switch circuit 54. An output end of the low noise amplifier circuit 21 is connected to the radio-frequency output terminals 121 and 122 via the switch circuit 55.

The impedance matching circuit 41 is connected to the output end of the power amplifier circuit 11 and is connected to input ends of the transmission filter circuits 61T and 62T via the switch circuit 51. The impedance matching circuit 41 is capable of performing impedance matching between output impedance of the power amplifier circuit 11 and input impedance of the switch circuit 51.

The impedance matching circuit 42 is connected to the input end of the low noise amplifier circuit 21 and is connected to output ends of the reception filter circuits 61R and 62R via the switch circuit 54. The impedance matching circuit 42 is capable of performing impedance matching between output impedance of the switch circuit 54 and input impedance of the low noise amplifier circuit 21.

The impedance matching circuit 43 is connected to an output end of the transmission filter circuit 61T and an input end of the reception filter circuit 61R and is connected to the antenna connection terminal 100 via the switch circuit 53. The impedance matching circuit 43 is capable of performing impedance matching between the switch circuit 53 and the duplexer 61.

The impedance matching circuit 44 is connected to an output end of the transmission filter circuit 62T and an input end of the reception filter circuit 62R and is connected to the antenna connection terminal 100 via the switch circuit 53. The impedance matching circuit 44 is capable of performing impedance matching between the switch circuit 53 and the duplexer 62.

The switch circuit 51 is an example of a first switch circuit. The switch circuit 51 is connected between the output end of the power amplifier circuit 11 and the input ends of the transmission filter circuits 61T and 62T. The switch circuit 51 has terminals 511 to 513. The terminal 511 is connected to the output end of the power amplifier circuit 11 via the impedance matching circuit 41. The terminal 512 is connected to the input end of the transmission filter circuit 61T. The terminal 513 is connected to the input end of the transmission filter circuit 62T.

In this connection configuration, the switch 51 is capable of connecting the terminal 511 to either of the terminals 512 and 513, for example, based on the control signal from the RFIC 3. In other words, the switch circuit 51 is capable of switching the connection of the output end of the power amplifier circuit 11 between the transmission filter circuits 61T and 62T. The switch circuit 51 is composed of, for example, a single-pole double-throw (SPDT) switch and may be called a band selection switch.

The switch circuit 52 is an example of a second switch circuit. The switch circuit 52 is connected between the radio-frequency input terminals 111 and 112 and the input end of the power amplifier circuit 11. The switch circuit 52 has terminals 521 to 523. The terminal 521 is connected to the input end of the power amplifier circuit 11. The terminals 522 and 523 are connected to the radio-frequency input terminals 111 and 112, respectively.

In this connection configuration, the switch circuit 52 is capable of connecting the terminal 521 to either of the terminals 522 and 523, for example, based on the control signal from the RFIC 3. In other words, the switch circuit 52 is capable of switching the connection of the input end of the power amplifier circuit 11 between the radio-frequency input terminals 111 and 112. The switch circuit 52 is composed of, for example, an SPDT switch and may be called an in-switch.

The switch circuit 53 is an example of a third switch circuit. The switch circuit 53 is connected between the antenna connection terminal 100 and the duplexers 61 and 62. The switch circuit 53 has terminals 531 to 533. The terminal 531 is connected to the antenna connection terminal 100. The terminal 532 is connected to the output end of the transmission filter circuit 61T and the input end of the reception filter circuit 61R via the impedance matching circuit 43. The terminal 533 is connected to the output end of the transmission filter circuit 62T and the input end of the reception filter circuit 62R via the impedance matching circuit 44.

In this connection configuration, the switch circuit 53 is capable of connecting the terminal 531 to either or both of the terminals 532 and 533, for example, based on the control signal from the RFIC 3. In other words, the switch circuit 53 is capable of switching between connection and non-connection between the antenna connection terminal 100 and the duplexer 61 and switching between connection and non-connection between the antenna connection terminal 100 and the duplexer 62. The switch circuit 53 is composed of a multi-connection switch and may be called an antenna switch.

The switch circuit 54 is connected between the input end of the low noise amplifier circuit 21 and the output ends of the reception filter circuits 61R and 62R. The switch circuit 54 has terminals 541 to 543. The terminal 541 is connected to the input end of the low noise amplifier circuit 21 via the impedance matching circuit 42. The terminal 542 is connected to the output end of the reception filter circuit 61R. The terminal 543 is connected to the output end of the reception filter circuit 62R.

In this connection configuration, the switch circuit 54 is capable of connecting the terminal 541 to either of the terminals 542 and 543, for example, based on the control signal from the RFIC 3. In other words, the switch circuit 54 is capable of switching the connection of the input end of the low noise amplifier circuit 21 between the reception filter circuits 61R and 62R. The switch circuit 54 is composed of, for example, an SPDT switch.

The switch circuit 55 is connected between the radio-frequency output terminals 121 and 122 and the output end of the low noise amplifier circuit 21. The switch circuit 55 has terminals 551 to 553. The terminal 551 is connected to the output end of the low noise amplifier circuit 21. The terminals 552 and 553 are connected to the radio-frequency output terminals 121 and 122, respectively.

In this connection configuration, the switch circuit 55 is capable of connecting the terminal 551 to either of the terminals 552 and 553, for example, based on the control signal from the RFIC 3. In other words, the switch circuit 55 is capable of switching the connection of the output end of the low noise amplifier circuit 21 between the radio-frequency output terminals 121 and 122. The switch circuit 55 is composed of, for example, an SPDT switch and may be called an out-switch.

The duplexer 61 is capable of passing the radio-frequency signal in the band A. The duplexer 61 transmits the transmission signal and the reception signal in the band A using a frequency division duplex (FDD) method. The duplexer 61 includes the transmission filter circuit 61T and the reception filter circuit 61R.

The transmission filter circuit 61T (A-Tx) has a passband including an uplink operating band of the band A. Accordingly, the transmission filter circuit 61T is capable of passing the transmission signal in the band A. The transmission filter circuit 61T is connected between the power amplifier circuit 11 and the antenna connection terminal 100. Specifically, the input end of the transmission filter circuit 61T is connected to the output end of the power amplifier circuit 11 via the switch circuit 51 and the impedance matching circuit 41. In contrast, the output end of the transmission filter circuit 61T is connected to the antenna connection terminal 100 via the impedance matching circuit 43 and the switch circuit 53.

The reception filter circuit 61R (A-Rx) has a passband including a downlink operating band of the band A. Accordingly, the reception filter circuit 61R is capable of passing the reception signal in the band A. The reception filter circuit 61R is connected between the antenna connection terminal 100 and the low noise amplifier circuit 21. Specifically, the input end of the reception filter circuit 61R is connected to the antenna connection terminal 100 via the impedance matching circuit 43 and the switch circuit 53. In contrast, the output end of the reception filter circuit 61R is connected to the low noise amplifier circuit 21 via the switch circuit 54 and the impedance matching circuit 42.

The duplexer 62 is capable of passing the radio-frequency signal in the band B. The duplexer 62 transmits the transmission signal and the reception signal in the band B using the FDD method. The duplexer 62 includes the transmission filter circuit 62T and the reception filter circuit 62R.

The transmission filter circuit 62T (B-Tx) has a passband including an uplink operating band of the band B. Accordingly, the transmission filter circuit 62T is capable of passing the transmission signal in the band B. The transmission filter circuit 62T is connected between the power amplifier circuit 11 and the antenna connection terminal 100. Specifically, the input end of the transmission filter circuit 62T is connected to the output end of the power amplifier circuit 11 via the switch circuit 51 and the impedance matching circuit 41. In contrast, the output end of the transmission filter circuit 62T is connected to the antenna connection terminal 100 via the impedance matching circuit 44 and the switch circuit 53.

The reception filter circuit 62R (B-Rx) has a passband including a downlink operating band of the band B. Accordingly, the reception filter circuit 62R is capable of passing the reception signal in the band B. The reception filter circuit 62R is connected between the antenna connection terminal 100 and the low noise amplifier circuit 21. Specifically, the input end of the reception filter circuit 62R is connected to the antenna connection terminal 100 via the impedance matching circuit 44 and the switch circuit 53. In contrast, the output end of the reception filter circuit 62R is connected to the low noise amplifier circuit 21 via the switch circuit 54 and the impedance matching circuit 42.

The control circuit 80 is a power amplifier controller that controls the power amplifier circuit 11. The control circuit 80 receives the control signal from the RFIC 3 via the control terminal 130 and supplies the control signal to the power amplifier circuit 11.

One or more circuits, among the circuits illustrated in FIG. 1, are not necessarily included in the radio-frequency module 1. For example, the radio-frequency module 1 does not necessarily include the circuits for reception as long as the radio-frequency module 1 includes the circuits for transmission. Specifically, the radio-frequency module 1 does not necessarily include the low noise amplifier circuit 21, the impedance matching circuit 42, the switch circuits 54 and 55, and the reception filter circuits 61R and 62R. In contrast, the radio-frequency module 1 does not necessarily include the circuits for transmission as long as the radio-frequency module 1 includes the circuits for reception.

[1.2 Arrangement of Components in Radio-Frequency Module 1]

Next, an example of the arrangement of the components in the radio-frequency module 1 having the above configuration will be specifically described with reference to FIG. 2 and FIG. 3.

Figure 2:
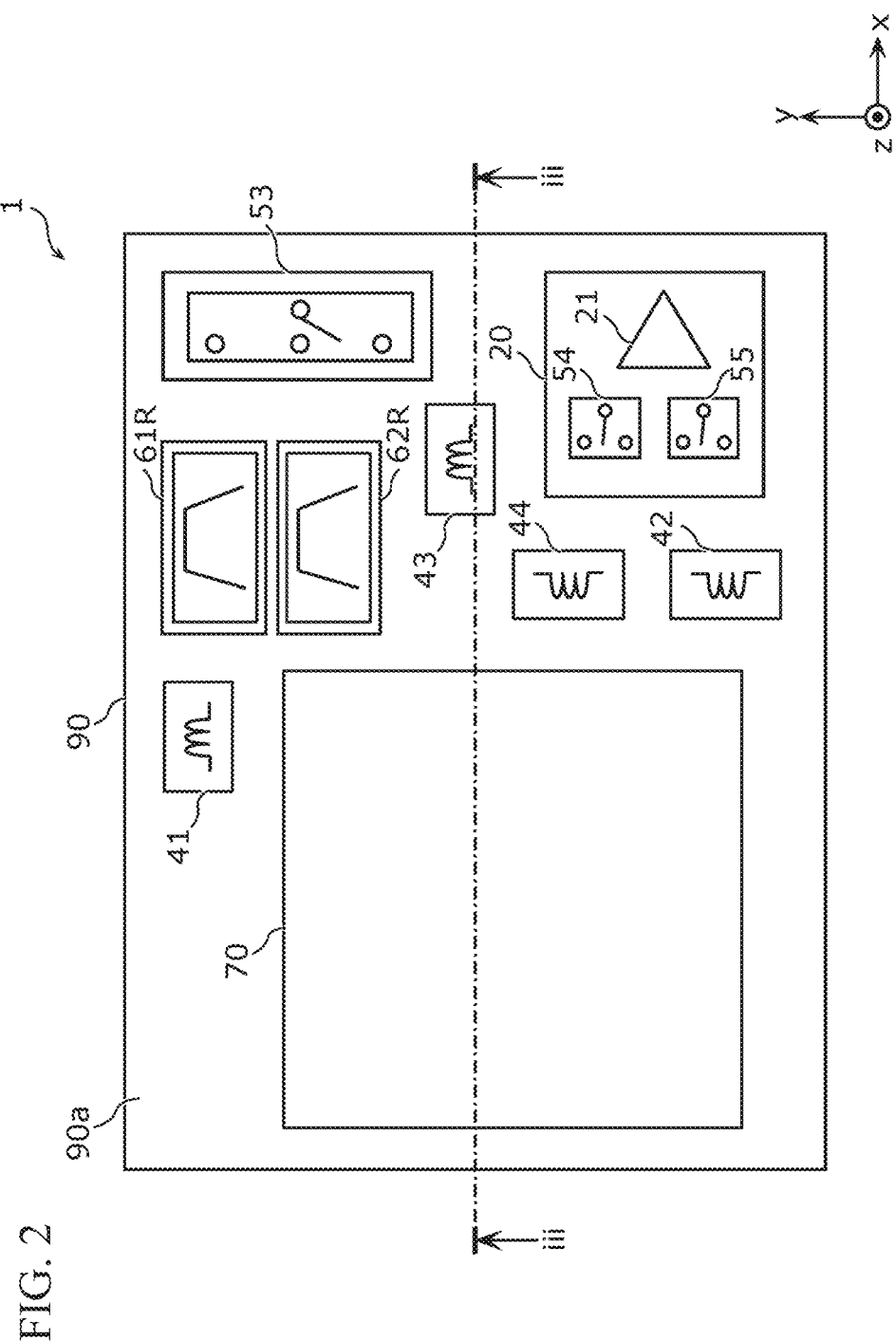
FIG. 2 is a plan view of the radio-frequency module according to the first embodiment.

FIG. 2 is a plan view of the radio-frequency module 1 according to the first embodiment. FIG. 3 is a cross-sectional view of the radio-frequency module 1 according to the first embodiment. The cross section of the radio-frequency module 1 in FIG. 3 is a cross section along the iii-iii line in FIG. 2.

The radio-frequency module 1 further includes a module substrate 90, a resin member 91, a shield electrode layer 92, and multiple external connection terminals 150, in addition to the components composing the circuits illustrated in FIG. 1. Illustration of the resin member 91 and the shield electrode layer 92 is omitted in FIG. 2. In addition, illustration of lines with which the multiple components arranged on the module substrate 90 are connected is omitted in FIG. 2 and FIG. 3, excluding a side-surface line 736.

The module substrate 90 has main surfaces 90a and 90b that are opposed to each other. Although the module substrate 90 has a rectangular shape in a plan view in the present embodiment, the shape of the module substrate 90 is not limited to this. Although, for example, a low temperature co-fired ceramics (LTCC) substrate having a laminated structure of multiple dielectric layers, a high temperature co-fired ceramics (HTCC) substrate, a component built-in substrate, a substrate including a redistribution layer (RDL), or a printed circuit board may be used as the module substrate 90, the module substrate 90 is not limited to these substrates.

Integrated circuits 20 and 70, the impedance matching circuits 41 to 44, the switch circuit 53, and the reception filter circuits 61R and 62R are arranged on the main surface 90a. The main surface 90a and the components on the main surface 90a are covered with the resin member 91.

The integrated circuit 20 includes the low noise amplifier circuit 21 and the switch circuits 54 and 55. The integrated circuit 20 is composed of, for example, complementary metal oxide semiconductor (CMOS). Specifically, the integrated circuit 20 may be manufactured through a silicon on insulator (SOI) process. Accordingly, it is possible to manufacture the integrated circuit 20 at a low cost. The integrated circuit 20 may be made of at least one of gallium arsenide, silicon-germanium (SiGe), and gallium nitride (GaN). This enables the low noise amplifier circuit 21 and the switch circuits 54 and 55 of high quality to be realized.

The integrated circuit 70 includes a first base 71, a second base 72, and a third base 73. The second base 72, the first base 71, and the third base 73 are laminated on the main surface 90a of the module substrate 90 in this order. The third base 73 is connected to the first base 71 using the side-surface line 736 formed on the side surfaces of the third base 73 and the first base 71. The integrated circuit 70 will be described in detail below with reference to FIG. 4 and FIG. 5.

The line with which the third base 73 is connected to the first base 71 is not limited to the side-surface line 736. For example, the third base 73 may be connected to the first base 71 via a bonding wire. In addition, for example, the third base 73 may be connected to the first base 71 via a via conductor passing through the third base 73.

Each of the impedance matching circuits 41 to 44 includes an inductor. Each of the impedance matching circuits 41 to 44 may include a capacitor, instead of the inductor, or may include both the inductor and the capacitor. Each of the inductors included in the impedance matching circuits 41 to 44 is composed of a surface mount device (SMD) in FIG. 2. Some or all of the inductors included in the impedance matching circuits 41 to 44 may be composed of integrated passive devices (IPDs).

The switch circuit 53 is composed of, for example, multiple metal-oxide-semiconductor field-effect transistors (MOSFETs) that are connected in series to each other. The number of stages of the MOSFET, which are connected in series, may be determined based on required withstanding voltage and is not particularly limited.

Each of the reception filter circuits 61R and 62R may be composed of any of, for example, a surface acoustic wave (SAW) filter, a bulk acoustic wave (BAW) filter, an LC resonant filter, and a dielectric filter and is not limited to these filters.

The main surface 90a and the components on the main surface 90a are covered with the resin member 91. The resin member 91 has a function to ensure the reliabilities, such as the mechanical strength and the moisture resistance, of the components on the main surface 90a. The resin member 91 is not necessarily provided.

The shield electrode layer 92 is a metallic thin film that is formed using, for example, a sputtering method. The shield electrode layer 92 is formed so as to cover the upper surface and the side surfaces of the resin member 91 and the side surfaces of the module substrate 90. The shield electrode layer 92 is set to ground potential to inhibit external noise from entering the components composing the radio-frequency module 1.

The multiple external connection terminals 150 are arranged on the main surface 90b. The multiple external connection terminals 150 include a ground terminal, in addition to the antenna connection terminal 100, the radio-frequency input terminals 111 and 112, the radio-frequency output terminals 121 and 122, and the control terminal 130 illustrated in FIG. 1. Each of the multiple external connection terminals 150 is joined to, for example, an input-output terminal and/or a ground terminal on a mother board arranged in the negative direction of the z axis of the radio-frequency module 1. Although, for example, bump electrodes may be used as the multiple external connection terminals 150, the multiple external connection terminals 150 are not limited to the bump electrodes.

Figure 3:
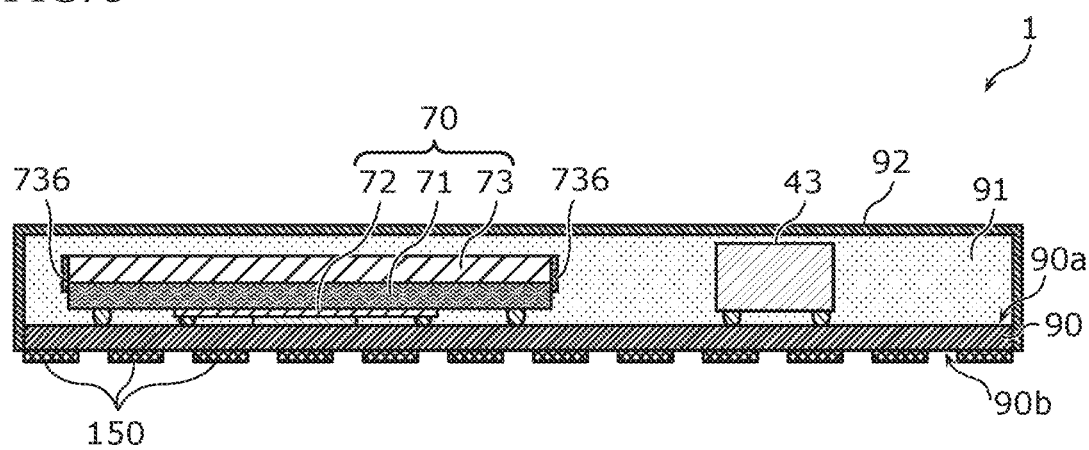
FIG. 3 is a cross-sectional view of the radio-frequency module according to the first embodiment.

The arrangements of the components illustrated in FIG. 2 and FIG. 3 are only examples and are not limited to the above ones. For example, part or all of the multiple components may be arranged on the main surface 90b of the module substrate 90. In this case, the main surface 90b and the components on the main surface 90b may be covered with a resin member.

[1.3 Configuration of Integrated Circuit 70]

Figure 4:
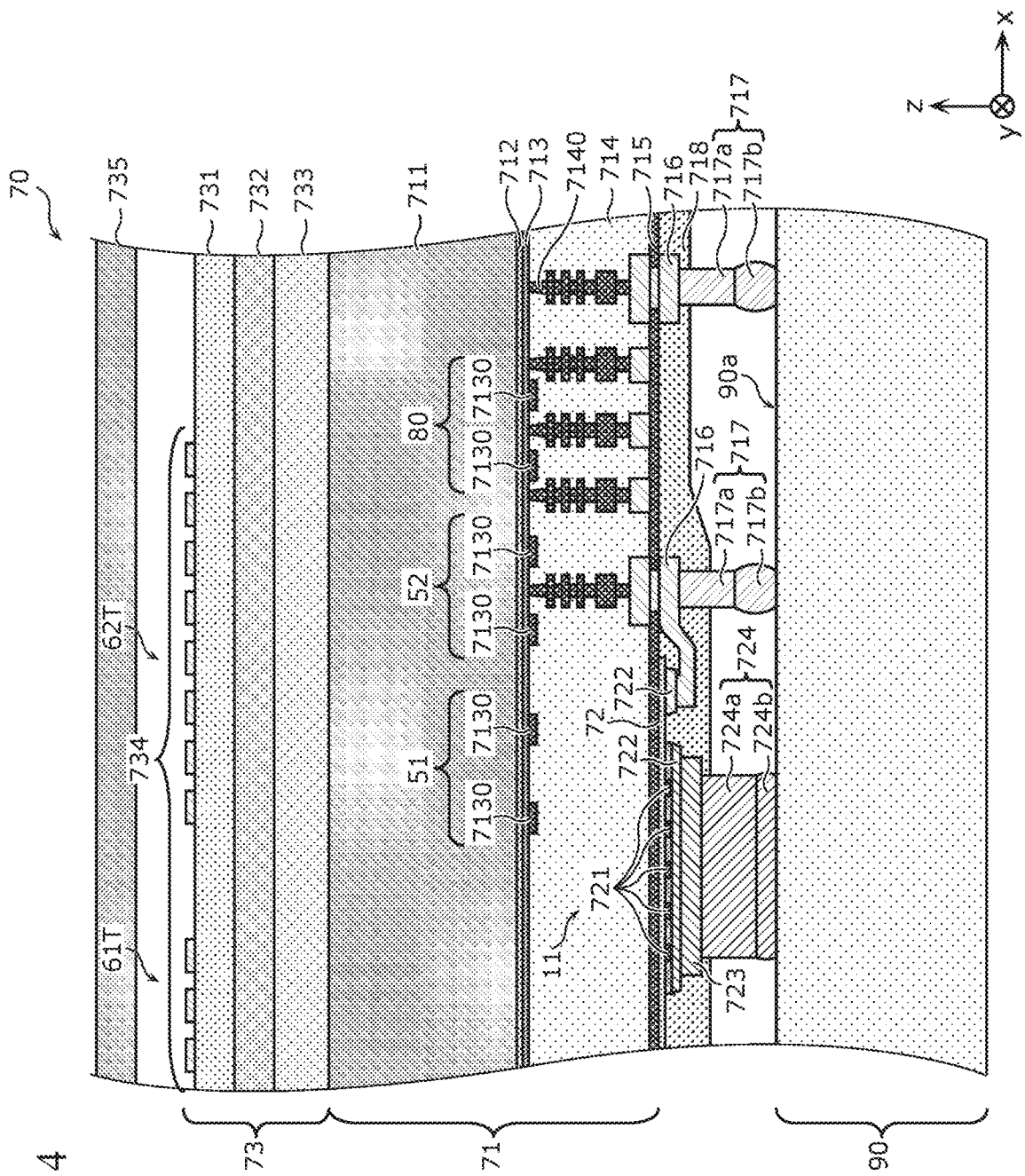
FIG. 4 is a partial cross-sectional view of the radio-frequency module according to the first embodiment.
Figure 5:
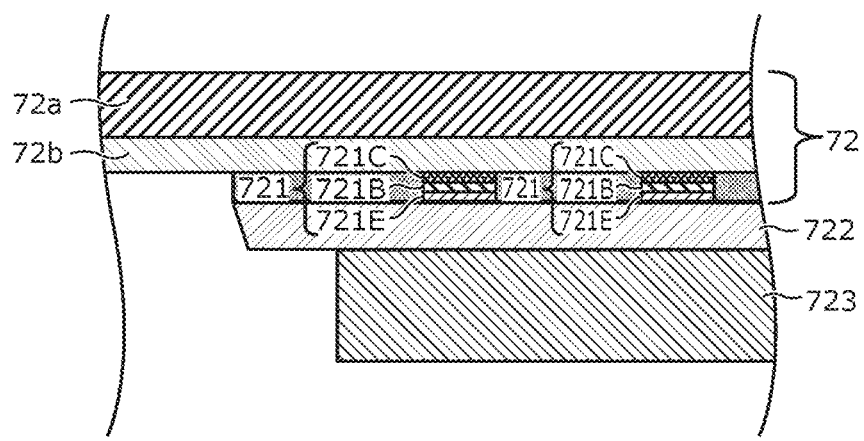
FIG. 5 is a partial cross-sectional view of the radio-frequency module according to the first embodiment.

Next, the configuration of the integrated circuit 70 will be described with reference to FIG. 4 and FIG. 5. FIG. 4 and FIG. 5 are partial cross-sectional views of the radio-frequency module 1 according to the first embodiment. Specifically, FIG. 4 and FIG. 5 are enlarged cross-sectional views of the integrated circuit 70 arranged on the main surface 90a of the module substrate 90. Illustration of lines and electrodes on or in the module substrate 90 is omitted in FIG. 4.

As illustrated in FIG. 4, the integrated circuit 70 includes the first base 71, the second base 72, and the third base 73. At least part of the first base 71 is overlapped with at least part of the second base 72 and at least part of the third base 73 in a plan view.

[1.3.1 Configuration of First Base 71]

The first base 71 will be described here. At least part of the first base 71 is made of a first semiconductor material. Silicon (Si) is used as the first semiconductor material here. The first semiconductor material is not limited to silicon. For example, a material containing any of gallium arsenide, aluminium arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) ($Ga_2O_3$) as the major component or a material containing multicomponent mixed crystal made of multiple materials, among the above materials, as the major component may be used as the first semiconductor material. The first semiconductor material is not limited to the above materials.

The control circuit 80 and the switch circuits 51 and 52 are formed in the first base 71 as first electrical circuits. The first electrical circuits formed in the first base 71 are not limited to the control circuit 80 and the switch circuits 51 and 52. For example, any or only arbitrary two circuits of the control circuit 80 and the switch circuits 51 and 52 may be formed in the first base 71 as the first electrical circuits. In addition, a control circuit (not illustrated) that controls the switch circuit 51 and/or 52 may be formed in the first base 71 as the first electrical circuit. Furthermore, at least one of the impedance matching circuits 41 to 44 may be formed in the first base 71 as the first electrical circuit.

As illustrated in FIG. 4, the first base 71 includes a silicon substrate 711, a silicon dioxide ($SiO_2$) layer 712, a silicon layer 713, a silicon dioxide layer 714, and a silicon nitride (SiN) layer 715. The silicon dioxide layer 712, the silicon layer 713, the silicon dioxide layer 714, and the silicon nitride layer 715 are laminated on the silicon substrate 711 in this order.

The silicon substrate 711 is made of, for example, silicon single crystal and is used as a supporting substrate.

The silicon dioxide layer 712 is arranged on the silicon substrate 711 and is used as an insulating layer.

The silicon layer 713 is arranged on the silicon dioxide layer 712 and is used as a device layer. Multiple circuit elements 7130 composing the control circuit 80 and the switch circuits 51 and 52 are formed on the silicon layer 713.

The silicon dioxide layer 714 is arranged on the silicon layer 713 and is used a line forming layer. Lines for connecting the control circuit 80 and the switch circuits 51 and 52, which are formed on the silicon layer 713, to electrodes 716 formed on the surface of the silicon nitride layer 715 are formed in the silicon dioxide layer 714. The lines include multiple wiring layers (not illustrated) and multiple via conductors 7140 with which the multiple wiring layers are connected. The multiple wiring layers and the via conductors 7140 are made of, for example, copper or aluminium.

The silicon nitride layer 715 is arranged on the silicon dioxide layer 714 and is used as a passivation layer. The electrodes 716, serving as the redistribution layer, are formed on part of the surface of the silicon nitride layer 715. In addition, the second base 72 is joined to another part of the surface of the silicon nitride layer 715.

The electrodes 716 are joined to electrodes (not illustrated) arranged on the module substrate 90 via electrodes 717. The surfaces of the electrodes 716 are insulated with a resin layer 718.

The electrode 717 is an example of a first electrode. The electrode 717 is protruded from the first base 71 toward the main surface 90a of the module substrate 90. The tip of the electrode 717 is joined to the main surface 90a. The electrode 717 includes a columnar conductor 717a and a bump electrode 717b. The bump electrode 717b is joined to an electrode (not illustrated) arranged on the main surface 90a of the module substrate 90.

The configuration of the first base 71 is not limited to the one illustrated in FIG. 4. For example, the first base 71 does not necessarily include one or some of the multiple layers on the silicon substrate 711.

[1.3.2 Configuration of Second Base 72]

Next, the second base 72 will be described. At least part of the second base 72 is made of a second semiconductor material having a thermal conductivity lower than that of the first semiconductor material. Gallium arsenide is used as the second semiconductor material. The second semiconductor material is not limited to gallium arsenide. For example, a material containing any of gallium arsenide, aluminium arsenide, indium arsenide, indium phosphide, gallium phosphide, indium antimonide, gallium nitride, indium nitride, aluminum nitride, silicon-germanium, silicon carbide, gallium oxide (III), and gallium bismuth (GaBi) as the major component or a material containing multicomponent mixed crystal made of multiple materials, among the above materials, as the major component may be used as the second semiconductor material. The second semiconductor material is not limited to the above materials.

The power amplifier circuit 11 is formed in the second base 72. Specifically, multiple circuit elements 721, electrodes (not illustrated) for applying voltage to the multiple circuit elements 721 or electrodes (not illustrated) for supplying current are formed in the second base 72. The multiple circuit elements 721 are, for example, a heterojunction bipolar transistor (HBT) including multiple unit transistors that are connected in parallel to each other and compose the power amplifier circuit 11. The low noise amplifier circuit 21 may be formed in the second base 72, instead of the power amplifier circuit 11. In other words, it is sufficient for the second base 72 to include an amplifier circuit.

As illustrated in FIG. 5, the second base 72 includes a semiconductor layer 72a, an epitaxial layer 72b formed on the surface of the semiconductor layer 72a, and the multiple circuit elements 721. The semiconductor layer 72a is made of the second semiconductor material and is joined to the silicon nitride layer 715 of the first base 71. The semiconductor layer 72a is, for example, a GaAs layer. The circuit element 721 includes a collector layer 721C, a base layer 721B, and an emitter layer 721E. The collector layer 721C, the base layer 721B, and the emitter layer 721E are laminated on the epitaxial layer 72b in this order. In other words, in the circuit element 721, the collector layer 721C, the base layer 721B, and the emitter layer 721E are laminated in this order from the first base 71 side.

As an example, the collector layer 721C is made of n-type gallium arsenide, the base layer 721B is made of p-type gallium arsenide, and the emitter layer 721E is made of n-type indium gallium phosphide (InGaP). The emitter layer 721E is joined to an electrode 723 via an element 722 formed on the surface of the second base 72. The electrode 723 is joined to the main surface 90a of the module substrate 90 via an electrode 724.

The electrode 724 is an example of a second electrode. The electrode 724 is protruded from the second base 72 toward the main surface 90a of the module substrate 90. The tip of the electrode 724 is joined to the main surface 90a. The electrode 724 includes a columnar conductor 724a and a bump electrode 724b. The bump electrode 724b is joined to an electrode (not illustrated) arranged on the main surface 90a of the module substrate 90.

The configuration of the second base 72 is not limited to the one illustrated in FIG. 4 and FIG. 5.

[1.3.3 Configuration of Third Base 73]

Next, the third base 73 will be described. At least part of the third base 73 is made of a piezoelectric material. The transmission filter circuits 61T and 62T are formed in the third base 73. The filter circuits formed in the third base 73 are not limited to the transmission filter circuits 61T and 62T. Only one of the transmission filter circuits 61T and 62T may be formed in the third base 73 or the reception filter circuit 61R and/or 62R may be formed in the third base 73.

In the present embodiment, each of the transmission filter circuits 61T and 62T is composed of a SAW filter. The third base 73 includes a piezoelectric layer 731, a low acoustic velocity layer 732, a high acoustic velocity layer 733, interdigital transducer (IDT) electrodes 734, and a cover layer 735, as illustrated in FIG. 4.

The piezoelectric layer 731 is made of the piezoelectric material and the IDT electrodes 734 are formed on the surface of the piezoelectric layer 731. Although, for example, lithium tantalate ($LiTaO_3$) or lithium niobate ($LiNbO_3$) may be used as the piezoelectric material, the piezoelectric material is not limited the above ones.

The low acoustic velocity layer 732 is arranged between the piezoelectric layer 731 and the high acoustic velocity layer 733 in a sectional view. The acoustic velocity of bulk waves propagating through the low acoustic velocity layer 732 is lower than the acoustic velocity of bulk waves propagating through the piezoelectric layer 731. Although, for example, a compound resulting from addition of fluorine, carbon, or boron to glass, silicon monoxide, silicon oxynitride, tantalum oxide, or silicon monoxide may be used as the material of the low acoustic velocity layer 732, the material of the low acoustic velocity layer 732 is not limited to the above ones.

The high acoustic velocity layer 733 is supported by the silicon substrate 711 of the first base 71. The acoustic velocity of bulk waves propagating through the high acoustic velocity layer 733 is higher than the acoustic velocity of the bulk waves propagating through the piezoelectric layer 731. Although, for example, aluminum nitride (AlN), aluminium oxide ($Al_2O_3$), silicon carbide (SiC), silicon oxynitride (SiON), silicon, diamond-like carbon (DLC), or diamond may be used as the material of the high acoustic velocity layer 733, the material of the high acoustic velocity layer 733 is not limited to the above ones.

The high acoustic velocity layer 733, the low acoustic velocity layer 732, the piezoelectric layer 731 are laminated on the silicon substrate 711 in this order.

The cover layer 735 forms space on the surface of the piezoelectric layer 731 on which the IDT electrodes 734 are formed.

The configuration of the third base 73 is not limited to the configuration illustrated in FIG. 4. For example, the third base 73 does not necessarily include one or both of the low acoustic velocity layer 732 and the high acoustic velocity layer 733. The third base 73 may include a silicon dioxide film on the piezoelectric layer 731.

Although a combination of silicon and gallium arsenide is used as the combination of the first semiconductor material and the second semiconductor material here, the combination of the first semiconductor material and the second semiconductor material is not limited to the above one. Any combination may be used as long as the first semiconductor material is different from the second semiconductor material and has a thermal conductivity higher than that of the second semiconductor material. In other words, it is sufficient for the second semiconductor material to be a semiconductor material that is different from the first semiconductor material and that has a thermal conductivity lower than that of the first semiconductor material. Since the thermal conductivity of silicon is 156 (W/m·K) and the thermal conductivity of gallium arsenide is 46 (W/m·K), the combination of silicon and gallium arsenide is capable of being used as the combination of the first semiconductor material and the second semiconductor material.

[1.4 Effects]

As described above, the radio-frequency module 1 according to the present embodiment includes the first base 71 at least part of which is made of the first semiconductor material; the second base 72 at least part of which is made of the second semiconductor material having a thermal conductivity lower than that of the first semiconductor material and which includes the power amplifier circuit 11; the third base 73 at least part of which is made of the piezoelectric material and which includes the transmission filter circuit 61T and/or 62T; and the module substrate 90 having the main surface 90a on which the first base 71, the second base 72, and the third base 73 are arranged. The first base 71 is joined to the main surface 90a via the electrode 717. The second base 72 is arranged between the module substrate 90 and the first base 71 in a sectional view and is joined to the main surface 90a via the electrode 724. At least part of the first base 71 is overlapped with at least part of the second base 72 and at least part of the third base 73 in a plan view.

With the above configuration, since the second base 72 including the power amplifier circuit 11 and the third base 73 including the transmission filter circuit 61T and/or 62T are overlapped with the first base 71 in a plan view, it is possible to contribute to reduction in size of the radio-frequency module 1. In addition, it is possible to effectively discharge heat generated in the power amplifier circuit 11 formed in the second base 72 to the outside via the first base 71 made of the first semiconductor material having the thermal conductivity higher than that of the second semiconductor material composing the second base 72 and via the electrode 717. Furthermore, it is possible to suppress degradation of characteristics due to heat of the transmission filter circuit 61T and/or 62T formed in the third base 73.

For example, in the radio-frequency module 1 according to the present embodiment, the first base 71 may include the first electrical circuit.

With the above configuration, it is possible to contribute to further reduction in size of the radio-frequency module 1.

For example, in the radio-frequency module 1 according to the present embodiment, the second base 72, the first base 71, and the third base 73 may be laminated in this order from the module substrate 90 side.

With the above configuration, since the second base 72, the first base 71, and the third base 73 are laminated in this order, it is possible to reduce the area in which the components are mounted while realizing improvement of heat dissipation efficiency of the power amplifier circuit 11.

For example, in the radio-frequency module 1 according to the present embodiment, the third base 73 may be connected to the first base 71 via the side-surface line 736 formed on side surfaces of the third base 73.

With the above configuration, it is possible to realize electrical connection between the third base 73 and the first base 71 with the side-surface line 736.

For example, in the radio-frequency module 1 according to the present embodiment, the transmission filter circuit 61T and/or 62T may include a SAW filter.

With the above configuration, it is possible to form the SAW filter in the third base 73.

For example, in the radio-frequency module 1 according to the present embodiment, the third base 73 may include the piezoelectric layer 731 that is made of the piezoelectric material and that has the IDT electrodes 734 formed thereon, the low acoustic velocity layer 732 the acoustic velocity of bulk waves propagating through which is lower than the acoustic velocity of bulk waves propagating through the piezoelectric layer 731, and the high acoustic velocity layer 733 the acoustic velocity of bulk waves propagating through which is higher than the acoustic velocity of the bulk waves propagating through the piezoelectric layer 731. The high acoustic velocity layer 733, the low acoustic velocity layer 732, and the piezoelectric layer 731 may be laminated in this order on the first base 71.

With the above configuration, it is possible to use the first base 71 as the supporting substrate of the SAW filter to contribute to reduction of the materials for the supporting substrate and the reduction in size of the radio-frequency module 1.

For example, in the radio-frequency module 1 according to the present embodiment, the first electrical circuit may include at least one of the control circuit 80, which controls the power amplifier circuit 11, the switch circuit 51, which is connected between the output end of the power amplifier circuit 11 and the transmission filter circuit 61T and/or 62T, and the switch circuit 52, which is connected between the input end of the power amplifier circuit 11 and the radio-frequency input terminals 111 and 112 through which the radio-frequency signal is received from the outside.

With the above configuration, at least one of the control circuit 80 and the switch circuits 51 and 52 is formed in the first base 71 overlapped with the second base 72 in a plan view. When the control circuit 80 is formed in the first base 71, it is possible to decrease the wiring length between the power amplifier circuit 11 formed in the second base 72 and the control circuit 80 to reduce the influence of digital noise caused by the control signal. In addition, when the switch circuit 51 or 52 is formed in the first base 71, it is possible to decrease the wiring length between the switch circuit 51 or 52 and the power amplifier circuit 11 to reduce wiring loss and mismatching loss caused by stray capacitance of the wiring.

For example, in the radio-frequency module 1 according to the present embodiment, the first semiconductor material may be silicon.

With the above configuration, since silicon is capable of being used as the first semiconductor material, it is possible to manufacture the first base 71 having a relatively high thermal conductivity at a relatively low cost.

For example, in the radio-frequency module 1 according to the present embodiment, the second semiconductor material may be gallium arsenide.

With the above configuration, since the gallium arsenide is capable of being used as the second semiconductor material, it is possible to manufacture the power amplifier circuit 11 of relatively high performance.

For example, in the radio-frequency module 1 according to the present embodiment, the power amplifier circuit 11 may include the circuit element 721 including the collector layer 721C, the base layer 721B, and the base layer 721B, and the collector layer 721C, the base layer 721B, and the emitter layer 721E may be laminated in this order from the first base 71 side.

With the above configuration, it is possible to simplify the wiring connected to the collector layer 721C, the base layer 721B, and the emitter layer 721E in a manufacturing process. In a plan view, the area of the collector layer 721C is greater than the respective areas of the base layer 721B and the emitter layer 721E. Accordingly, joining the collector layer 721C to the first base 71 enables the joining area to be increased, compared with a case in which the base layer 721B or the emitter layer 721E is joined to the first base 71. As a result, it is possible to enforce the joining between the first base 71 and the second base 72 to suppress peeling-off of the second base 72 from the first base 71.

The radio-frequency module 1 according to the present embodiment includes the first base 71 at least part of which is made of silicon or gallium nitride; the second base 72 at least part of which is made of gallium arsenide or silicon-germanium and which includes the power amplifier circuit 11; the third base 73 at least part of which is made of the piezoelectric material and which includes the transmission filter circuit 61T and/or 62T; and the module substrate 90 having the main surface 90a on which the first base 71, the second base 72, and the third base 73 are arranged. The first base 71 is joined to the main surface 90a via the electrode 717. The second base 72 is arranged between the module substrate 90 and the first base 71 in a sectional view and is joined to the main surface 90a via the electrode 724. At least part of the first base 71 is overlapped with at least part of the second base 72 and at least part of the third base 73 in a plan view.

With the above configuration, since the second base 72 including the power amplifier circuit 11 and the third base 73 including the transmission filter circuit 61T and/or 62T are overlapped with the first base 71 in a plan view, it is possible to contribute to the reduction in size of the radio-frequency module 1. In addition, it is possible to effectively discharge the heat generated in the power amplifier circuit 11 formed in the second base 72 to the outside via the first base 71 made of silicon or gallium nitride having the thermal conductivity higher than that of gallium arsenide or silicon-germanium composing the second base 72 and via the electrode 717. Furthermore, it is possible to suppress the degradation of the characteristics due to the heat of the transmission filter circuit 61T and/or 62T formed in the third base 73.

The communication apparatus 5 according to the present embodiment includes the RFIC 3, which processes the radio-frequency signal, and the radio-frequency module 1, which transmits the radio-frequency signal between the RFIC 3 and the antenna 2.

With the above configuration, it is possible to realize the same effects as those of the radio-frequency module 1 in the communication apparatus 5.

Second Embodiment

Next, a second embodiment will be described. The present embodiment mainly differs from the first embodiment described above in the configuration of the integrated circuit including the first base, the second base, and the third base. The radio-frequency module according to the present embodiment will be described, focusing on points different from the first embodiment described above.

The communication apparatus 5 and the radio-frequency module 1 according to the present embodiment are the same as the communication apparatus 5 and the radio-frequency module 1 of the first embodiment described above excluding that an integrated circuit 70A is provided, instead of the integrated circuit 70. Accordingly, a description of the communication apparatus 5 and the radio-frequency module 1 is omitted herein and the configuration of the integrated circuit 70A will be described with reference to FIG. 6.

[2.1 Configuration of Integrated Circuit 70A]

Figure 6:
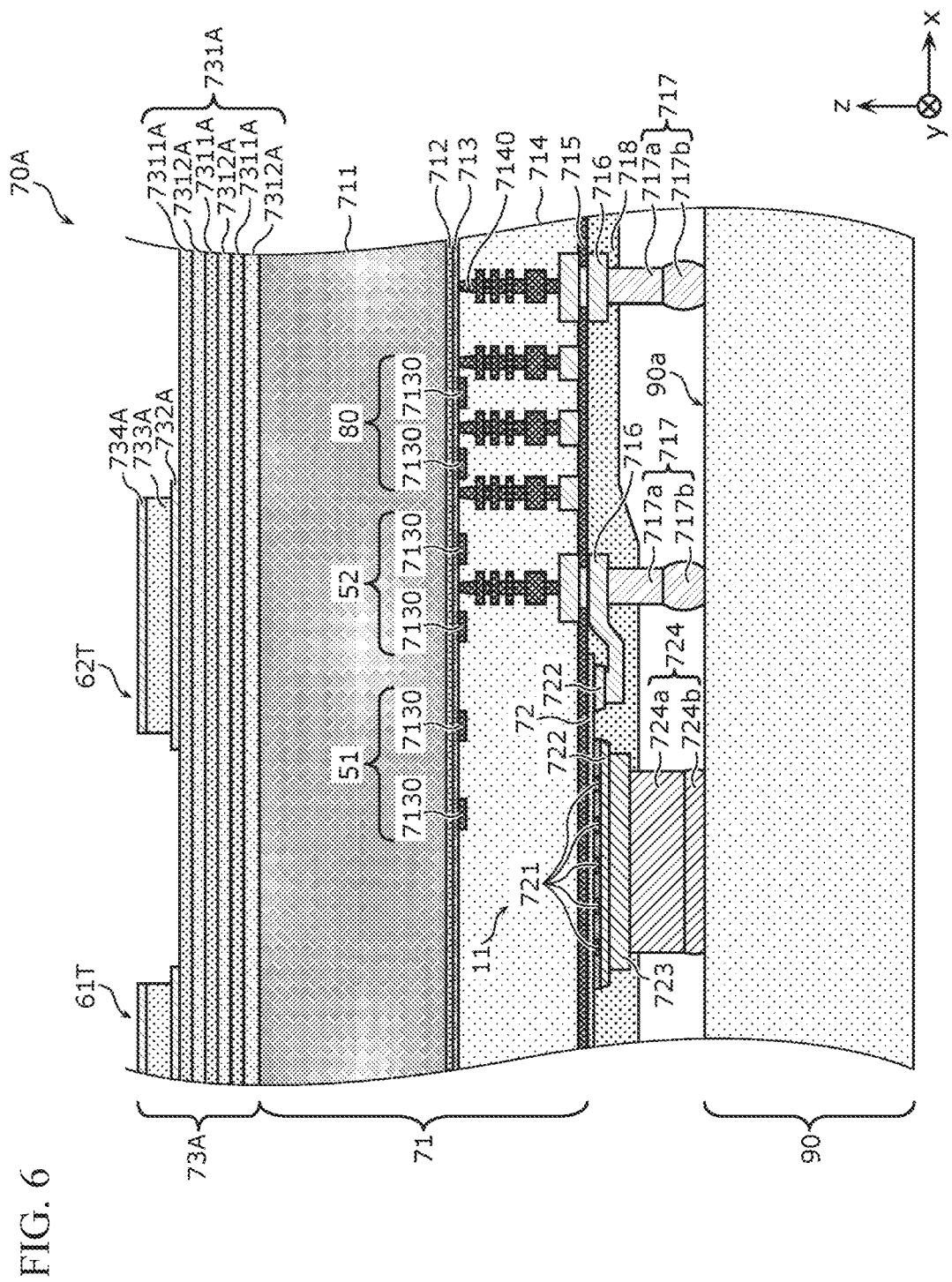
FIG. 6 is a partial cross-sectional view of a radio-frequency module according to a second embodiment.

FIG. 6 is a partial cross-sectional view of the radio-frequency module 1 according to the second embodiment. Specifically, FIG. 6 is a cross-sectional view of the integrated circuit 70A.

The integrated circuit 70A includes the first base 71, the second base 72, and a third base 73A. At least part of the third base 73A is made of the piezoelectric material, as in the first embodiment. The transmission filter circuits 61T and 62T are formed in the third base 73A. In the present embodiment, each of the transmission filter circuits 61T and 62T is composed of a solid mounted resonator (SMR) BAW filter. The third base 73A includes an acoustic multi-layer film 731A, a lower electrode 732A, a piezoelectric layer 733A, an upper electrode 734A, as illustrated in FIG. 6.

The acoustic multi-layer film 731A functions as a mirror layer that reflects the acoustic waves and is supported by the first base 71. The acoustic multi-layer film 731A includes multiple low acoustic impedance films 7311A and multiple high acoustic impedance films 7312A having acoustic impedances higher than those of the multiple low acoustic impedance films 7311A. The multiple low acoustic impedance films 7311A and the multiple high acoustic impedance films 7312A are alternately laminated on the silicon substrate 711 of the first base 71.

For example, silicon monoxide or aluminium may be used as the material of the low acoustic impedance films 7311A. For example, tungsten, platinum, molybdenum, or gold may be used as the material of the high acoustic impedance films 7312A.

The piezoelectric layer 733A is made of the piezoelectric material and is arranged between the lower electrode 732A and the upper electrode 734A. In other words, the lower electrode 732A, the piezoelectric layer 733A, and the upper electrode 734A are laminated on the acoustic multi-layer film 731A in this order. For example, aluminum nitride (AlN) may be used as the piezoelectric material.

The configuration of the third base 73A is not limited to the one illustrated in FIG. 6. For example, a film bulk acoustic resonator (FBAR) BAW filter may be formed in the third base 73A.

[2.2 Effects]

As described above, in the radio-frequency module 1 according to the present embodiment, the transmission filter circuit 61T and/or 62T includes a BAW filter.

With the above configuration, it is possible form the BAW filter in the third base 73A.

For example, in the radio-frequency module 1 according to the present embodiment, the third base 73A may include the acoustic multi-layer film 731A in which the multiple low acoustic impedance films 7311A and the multiple high acoustic impedance films 7312A having acoustic impedances higher than those of the multiple low acoustic impedance films 7311A are alternately laminated, the lower electrode 732A, the piezoelectric layer 733A made of the piezoelectric material, and the upper electrode 734A. The acoustic multi-layer film 731A, the lower electrode 732A, the piezoelectric layer 733A, and the upper electrode 734A may be laminated in this order on the first base 71.

With the above configuration, it is possible to use the first base 71 as the supporting substrate for the BAW filter to contribute to the reduction of the materials for the supporting substrate and the reduction in size of the radio-frequency module 1.

Third Embodiment

Next, a third embodiment will be described. The present embodiment mainly differs from the first embodiment described above in the configuration of the integrated circuit including the first base, the second base, and the third base. The radio-frequency module according to the present embodiment will be described, focusing on points different from the first embodiment described above.

The communication apparatus 5 and the radio-frequency module 1 according to the present embodiment are the same as the communication apparatus 5 and the radio-frequency module 1 of the first embodiment described above excluding that an integrated circuit 70B is provided, instead of the integrated circuit 70. Accordingly, a description of the communication apparatus 5 and the radio-frequency module 1 is omitted herein and the configuration of the integrated circuit 70B will be described with reference to FIG. 7.

[3.1 Configuration of Integrated Circuit 70B]

Figure 7:
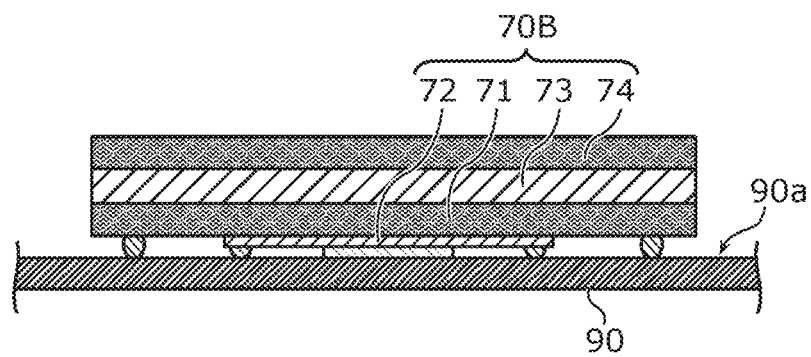
FIG. 7 is a partial cross-sectional view of a radio-frequency module according to a third embodiment.

FIG. 7 is a partial cross-sectional view of the radio-frequency module 1 according to the third embodiment. Specifically, FIG. 7 is a cross-sectional view of the integrated circuit 70B. Illustration of lines with which the bases in the integrated circuit 70B are connected is omitted in FIG. 7.

The integrated circuit 70B includes a fourth base 74, in addition to the first base 71, the second base 72, and the third base 73. At least part of the fourth base 74 is made of a third semiconductor material. Silicon is used as the third semiconductor material here, as in the first semiconductor material. The switch circuit 53 is formed in the fourth base 74 as a second electrical circuit. The second electrical circuit is not limited to the switch circuit 53.

[3.2 Effects]

As described above, the radio-frequency module 1 according to the present embodiment includes the fourth base 74 at least part of which is made of the third semiconductor material and which includes the second electrical circuit. The second base 72, the first base 71, the third base 73, and the fourth base 74 are laminated in this order from the module substrate 90 side.

With the above configuration, since the fourth base 74 is laminated, in addition to the first base 71, the second base 72, and the third base 73, it is possible to further reduce the area in which the components are mounted.

For example, in the radio-frequency module 1 according to the present embodiment, the second electrical circuit may include the switch circuit 53, which is connected between the transmission filter circuit 61T and/or 62T and the antenna connection terminal 100.

With the above configuration, the switch circuit 53 connected to the transmission filter circuit 61T and/or 62T is formed in the fourth base 74 laminated on the third base 73. Accordingly, it is possible to decrease the wiring length between the switch circuit 53 and the transmission filter circuit 61T and/or 62T to reduce the wiring loss and the mismatching loss caused by the stray capacitance of the wiring.

Fourth Embodiment

Next, a fourth embodiment will be described. The present embodiment mainly differs from the first embodiment described above in the configuration of the integrated circuit including the first base, the second base, and the third base. The radio-frequency module according to the present embodiment will be described, focusing on points different from the first embodiment described above.

The communication apparatus 5 and the radio-frequency module 1 according to the present embodiment are the same as the communication apparatus 5 and the radio-frequency module 1 of the first embodiment described above excluding that an integrated circuit 70C is provided, instead of the integrated circuit 70. Accordingly, a description of the communication apparatus 5 and the radio-frequency module 1 is omitted herein and the configuration of the integrated circuit 70C will be described with reference to FIG. 8.

[4.1 Configuration of Integrated Circuit 70C]

Figure 8:
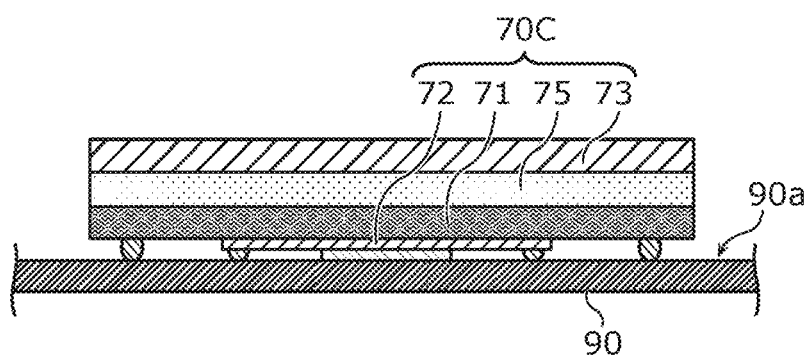
FIG. 8 is a partial cross-sectional view of a radio-frequency module according to a fourth embodiment.

FIG. 8 is a partial cross-sectional view of the radio-frequency module 1 according to the fourth embodiment. Specifically, FIG. 8 is a cross-sectional view of the integrated circuit 70C. Illustration of lines with which the bases in the integrated circuit 70C are connected is omitted in FIG. 8.

The integrated circuit 70C includes an insulating layer 75, in addition to the first base 71, the second base 72, and the third base 73.

The insulating layer 75 is arranged between the first base 71 and the third base 73 in a sectional view. In other words, in the integrated circuit 70C, the second base 72, the first base 71, the insulating layer 75, and the third base 73 are laminated in this order from the module substrate 90 side.

A material having a thermal conductivity lower than that of the first semiconductor material is used as the material of the insulating layer 75. Although, for example, silicon dioxide, silicon nitride, tantalum pentoxide ($Ta_2O_5$), polyimide, or epoxy resin may be used as the material of the insulating layer 75, the material of the insulating layer 75 is not limited to the above ones.

[4.2 Effects]

As described above, the radio-frequency module 1 according to the present embodiment includes the insulating layer 75, which is arranged between the first base 71 and the third base 73 in a sectional view and which is made of a material having a thermal conductivity lower than that of the first semiconductor material.

With the above configuration, the amount of heat from the first base 71 to the third base 73 is capable of being reduced with the insulating layer 75. Accordingly, it is possible to suppress the degradation of the characteristics due to increase in the temperature of the transmission filter circuit 61T and/or 62T formed in the third base 73.

Fifth Embodiment

Next, a fifth embodiment will be described. The present embodiment mainly differs from the first embodiment described above in the configuration of the integrated circuit including the first base, the second base, and the third base. The radio-frequency module according to the present embodiment will be described, focusing on points different from the first embodiment described above.

The communication apparatus 5 and the radio-frequency module 1 according to the present embodiment are the same as the communication apparatus 5 and the radio-frequency module 1 of the first embodiment described above excluding that an integrated circuit 70D is provided, instead of the integrated circuit 70. Accordingly, a description of the communication apparatus 5 and the radio-frequency module 1 is omitted herein and the configuration of the integrated circuit 70D will be described with reference to FIG. 9.

[5.1 Configuration of Integrated Circuit 70D]

Figure 9:
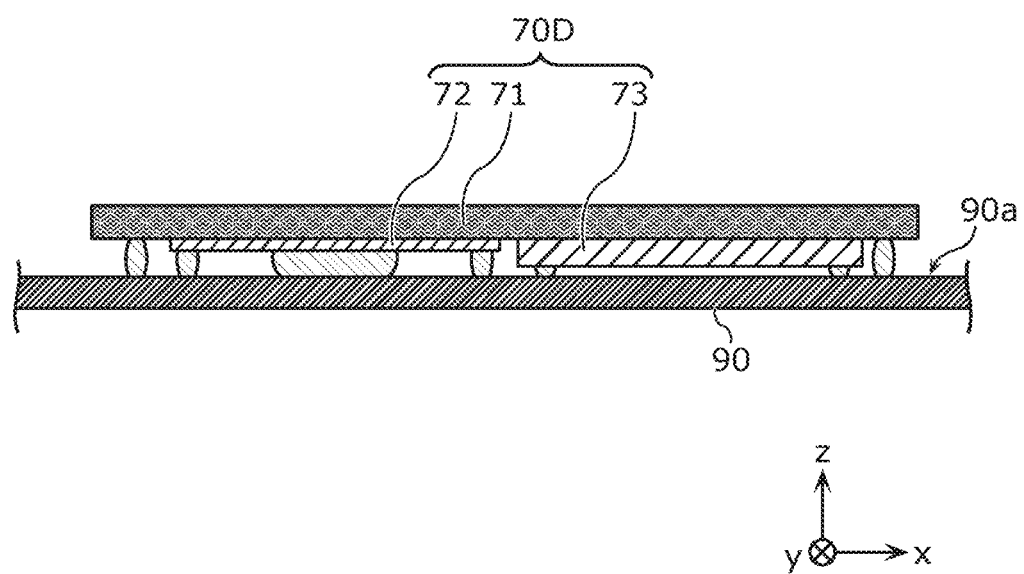
FIG. 9 is a partial cross-sectional view of a radio-frequency module according to a fifth embodiment.

FIG. 9 is a partial cross-sectional view of the radio-frequency module 1 according to the fifth embodiment. Specifically, FIG. 9 is a cross-sectional view of the integrated circuit 70D. Illustration of lines with which the bases in the integrated circuit 70D are connected is omitted in FIG. 9.

The integrated circuit 70D includes the first base 71, the second base 72, and the third base 73. In the integrated circuit 70D, the third base 73 is also arranged between the module substrate 90 and the first base 71 in a sectional view, in addition to the second base 72. Specifically, part of the first base 71 is overlapped with at least part of the second base 72 in a plan view and another part of the first base 71 is overlapped with at least part of the third base 73 in a plan view. In addition, the second base 72 is not overlapped with the third base 73 in a plan view.

[5.2 Effects]

As described above, in the radio-frequency module 1 according to the present embodiment, the third base 73 is arranged between the module substrate 90 and the first base 71, part of the first base 71 is overlapped with at least part of the second base 72 in a plan view, another part of the first base 71 is overlapped with at least part of the third base 73 in a plan view, and the second base 72 is not overlapped with the third base 73 in a plan view.

With the above configuration, since the second base 72 is not overlapped with the third base 73 in a plan view, the amount of heat from the second base 72 to the third base 73 is capable of being reduced. Accordingly, it is possible to suppress the degradation of the characteristics due to the increase in the temperature of the transmission filter circuit 61T and/or 62T formed in the third base 73.

Other Embodiments

Although the radio-frequency module and the communication apparatus according to the present disclosure are described above based on the embodiments, the radio-frequency module and the communication apparatus according to the present disclosure are not limited to the above embodiments. Other embodiments realized by combining arbitrary components in the above embodiments, modifications resulting from making various modifications supposed by the person skilled in the art to the above embodiments without necessarily departing from the sprit and scope of the present disclosure, various devices incorporating the radio-frequency module and the communication apparatus are also included in the present disclosure.

For example, the second embodiment may be combined with the third to fifth embodiments. Specifically, the third base 73A including the BAW filter may be used, instead of the third base 73 including the SAW filter, in the third to fifth embodiments. The modifications described in the first embodiment may be applied to the second to fifth embodiments.

INDUSTRIAL APPLICABILITY

The present disclosure is widely applicable to a communication device, such as a mobile phone, as the radio-frequency module arranged in a front-end unit.

REFERENCE SIGNS LIST 1 radio-frequency module
2 antenna
3 RFIC
4 BBIC
5 communication apparatus
11 power amplifier circuit
20, 70, 70A, 70B, 70C, 70D integrated circuit
21 low noise amplifier circuit
41, 42, 43 44 impedance matching circuit
51, 52, 53, 54, 55 switch circuit
61, 62 duplexer
61R, 62R reception filter circuit
61T, 62T transmission filter circuit
71 first base
72 second base
72a semiconductor layer
72b epitaxial layer
73, 73A third base
74 fourth base
75 insulating layer
80 control circuit
90 module substrate
90a, 90b main surface
91 resin member
92 shield electrode layer
100 antenna connection terminal
111, 112 radio-frequency input terminal
121, 122 radio-frequency output terminal
130 control terminal
150 external connection terminal
711 silicon substrate
712, 714 silicon dioxide layer
713 silicon layer
715 silicon nitride layer
716, 717, 722, 723, 724 electrode
717a, 724a columnar conductor
717b, 724b bump electrode
718 resin layer
721, 7130 circuit element
721B base layer
721C collector layer
721E emitter layer
731, 733A piezoelectric layer
731A acoustic multi-layer film
732 low acoustic velocity layer
732A lower electrode
733 high acoustic velocity layer
734 IDT electrode
734A upper electrode
735 cover layer
736 side-surface line
7140 via conductor
7311A low acoustic impedance film
7312A high acoustic impedance film

The invention claimed is:

1. A radio-frequency module comprising:
   a first base at least part of which is made of a first semiconductor material;
   a second base at least part of which is made of a second semiconductor material having a thermal conductivity lower than that of the first semiconductor material, the second base comprising an amplifier circuit;
   a third base at least part of which is made of a piezoelectric material, the third base comprising a filter circuit; and
   a module substrate having a main surface on which the first base, the second base, and the third base are arranged,
   wherein the first base is joined to the main surface via a first electrode,
   wherein the second base is arranged between the module substrate and the first base in a sectional view, and is joined to the main surface via a second electrode, and
   wherein at least part of the first base overlaps with at least part of the second base and at least part of the third base in a plan view.

2. The radio-frequency module according to claim 1, wherein the first base comprises a first electrical circuit.

3. The radio-frequency module according to claim 2, wherein the third base is connected to the first base via a side-surface line, the side-surface line being formed on side surfaces of the third base.

4. The radio-frequency module according to claim 2, wherein the first electrical circuit comprises a control circuit configured to control the amplifier circuit, a first switch circuit that is connected between an output end of the amplifier circuit and the filter circuit, or a second switch circuit that is connected between an input end of the amplifier circuit and an input terminal through which a radio-frequency signal is externally received.

5. The radio-frequency module according to claim 1, wherein the second base, the first base, and the third base are laminated, the second base being closest to the module substrate and the first base being between the second base and the third base.

6. The radio-frequency module according to claim 5, further comprising:
   a fourth base at least part of which is made of a third semiconductor material, the fourth base comprising a second electrical circuit,
   wherein the second base, the first base, the third base, and the fourth based are laminated, the second base being closest to the module substrate, the first base being between the second base and the third base, and the third base being between the first base and the fourth base.

7. The radio-frequency module according to claim 6, wherein the second electrical circuit comprises a third switch circuit that is connected between the filter circuit and an antenna connection terminal.

8. The radio-frequency module according to claim 5, further comprising:
   an insulating layer that is arranged between the first base and the third base in the sectional view, and that is made of a material having a thermal conductivity lower than that of the first semiconductor material.

9. The radio-frequency module according to claim 1, wherein the third base is arranged between the module substrate and the first base in the sectional view, wherein a first part of the first base overlaps with at least part of the second base in the plan view, wherein a second part of the first base overlaps with at least part of the third base in the plan view, and wherein the second base does not overlap with the third base in the plan view.

10. The radio-frequency module according to claim 1, wherein the amplifier circuit is a power amplifier circuit.

11. The radio-frequency module according to claim 1, wherein the filter circuit comprises a surface acoustic wave filter.

12. The radio-frequency module according to claim 11, wherein the third base comprises:
    a piezoelectric layer that is made of the piezoelectric material and that has interdigital transducer electrodes thereon,
    a low acoustic velocity layer, an acoustic velocity of bulk waves propagating through the low acoustic velocity layer being lower than an acoustic velocity of bulk waves propagating through the piezoelectric layer, and
    a high acoustic velocity layer, an acoustic velocity of bulk waves propagating through the high acoustic velocity layer being higher than the acoustic velocity of the bulk waves propagating through the piezoelectric layer, and
    wherein the high acoustic velocity layer, the low acoustic velocity layer, and the piezoelectric layer are laminated, the high acoustic velocity layer being closest the first base and the low acoustic velocity layer being between the high acoustic velocity layer and the piezoelectric layer.

13. The radio-frequency module according to claim 1, wherein the filter circuit comprises a bulk acoustic wave filter.

14. The radio-frequency module according to claim 13, wherein the third base comprises:
    an acoustic multi-layer film in which a plurality of low acoustic impedance films and a plurality of high acoustic impedance films are alternately laminated, the high acoustic impedance films having a higher acoustic impedance than the low acoustic impedance films,
    a lower electrode,
    a piezoelectric layer that is made of the piezoelectric material, and
    an upper electrode, and
    wherein the acoustic multi-layer film, the lower electrode, the piezoelectric layer, and the upper electrode are laminated, the acoustic multi-layer film being closest to the first base, the lower electrode being between the multi-layer film and the piezoelectric layer, and the piezoelectric layer being between the lower electrode and the upper electrode.

15. The radio-frequency module according to claim 1, wherein the first semiconductor material is silicon.

16. The radio-frequency module according to claim 1, wherein the second semiconductor material is gallium arsenide.

17. The radio-frequency module according to claim 1, wherein the amplifier circuit comprises a circuit element comprising a collector layer, a base layer, and an emitter layer, and
    wherein the collector layer, the base layer, and the emitter layer are laminated, the collector layer being closest to the first base and the base layer being between the collector layer and the emitter layer.

18. A radio-frequency module comprising:
a first base at least part of which is made of silicon or gallium nitride and which comprises a first electrical circuit;
a second base at least part of which is made of gallium arsenide or silicon-germanium and which comprises an amplifier circuit;
a third base at least part of which is made of a piezoelectric material and which comprises a filter circuit; and
a module substrate having a main surface on which the first base, the second base, and the third base are arranged,
wherein the first base is joined to the main surface via a first electrode,
wherein the second base is arranged between the module substrate and the first base in a sectional view and is joined to the main surface via a second electrode, and
wherein at least part of the first base overlaps with at least part of the second base and at least part of the third base in a plan view.

19. A communication apparatus comprising:
a signal processing circuit that processes a radio-frequency signal; and
the radio-frequency module according to claim 1, configured to transmit the radio-frequency signal between the signal processing circuit and an antenna.

20. A communication apparatus comprising:
a signal processing circuit that processes a radio-frequency signal; and
the radio-frequency module according to claim 18, configured to transmit the radio-frequency signal between the signal processing circuit and an antenna.

* * * * *